(12) United States Patent
Chuang

(10) Patent No.: US 8,692,627 B2
(45) Date of Patent: Apr. 8, 2014

(54) OSCILLATING SIGNAL GENERATING APPARATUS AND CONTROL SIGNAL GENERATOR OF THE OSCILLATING SIGNAL GENERATING APPARATUS

(75) Inventor: Chih-Hua Chuang, Hsinchu (TW)

(73) Assignee: Silicon Motion Inc., Jhubei, Hsinchu County (TW)

( * ) Notice: Subject to any disclaimer, the term of this patent is extended or adjusted under 35 U.S.C. 154(b) by 30 days.

(21) Appl. No.: 13/437,877

(22) Filed: Apr. 2, 2012

(65) Prior Publication Data
US 2013/0009718 A1 Jan. 10, 2013

(30) Foreign Application Priority Data
Jul. 8, 2011 (TW) .............................. 100124289 A

(51) Int. Cl.
*H03B 27/00* (2006.01)
*H03K 3/03* (2006.01)
(52) U.S. Cl.
USPC ............................................ 331/185; 331/57
(58) Field of Classification Search
USPC .................................................. 331/57, 185
See application file for complete search history.

(56) References Cited

U.S. PATENT DOCUMENTS

| 6,985,045 | B2 | 1/2006 | Zhang |
| 7,015,766 | B1 * | 3/2006 | Guo et al. ..................... 331/176 |
| 7,710,207 | B2 | 5/2010 | Wu |
| 2010/0013563 | A1 * | 1/2010 | Kim et al. ......................... 331/8 |

FOREIGN PATENT DOCUMENTS

TW 200539561 12/2005

* cited by examiner

*Primary Examiner* — Joseph Chang
(74) *Attorney, Agent, or Firm* — Winston Hsu; Scott Margo

(57) ABSTRACT

An oscillating signal generating device includes: an oscillating circuit arranged to generate an oscillating signal according to a current controlled signal; and a control signal generating circuit coupled to the oscillating circuit, the control signal generating circuit for receiving a first reference voltage and a second reference voltage, the control signal generating circuit operated between the first reference voltage and the second reference voltage, and the control signal generating circuit arranged to generate the current controlled signal according to a voltage input signal; wherein the control signal generating circuit is capable of monotonically generating the current controlled signal according to the voltage input signal when a voltage level of the voltage input signal falls between the first reference voltage and the second reference voltage.

13 Claims, 2 Drawing Sheets

OSCILLATING SIGNAL GENERATING APPARATUS AND CONTROL SIGNAL GENERATOR OF THE OSCILLATING SIGNAL GENERATING APPARATUS

BACKGROUND OF THE INVENTION

1. Field of the Invention

The present invention relates to a control signal generating circuit of an oscillating signal generating device, and more particularly to a control signal generating circuit capable of using any voltage level between a supply voltage source and a ground voltage to control the oscillating signal generating device.

2. Description of the Prior Art

Advanced semiconductor manufacturing processes for manufacturing integrated circuits can reduce the size of the integrated circuits. When an integrated circuit has a reduced size, the operating voltage range of the integrated circuit is smaller, meaning the voltage range of a control signal of the integrated circuit is also smaller. When the controlling voltage range of a voltage-controlled oscillator becomes smaller, the gain (Kvco) of the voltage-controlled oscillator should be larger in order to generate an oscillating output signal having a predetermined frequency range. As a result, the voltage-controlled oscillator may become very sensitive to the control voltage, which induces unwanted jitter in the oscillating output signal as a consequence. When the above voltage-controlled oscillator is applied in a phase-locked loop, the loop filter of the phase-locked loop needs to be able to filter out the induced jitter, which is only possible if the filtering capacitor of the loop filter is large enough. The cost of the phase-locked loop becomes higher if a large capacitor is required, however. Therefore, how to reduce the control voltage range of a control signal of a voltage-controlled oscillator while reducing the cost of the voltage-controlled oscillator has became an urgent problem in this field.

SUMMARY OF THE INVENTION

One of the objectives of the present invention is to provide a control signal generating circuit capable of using any voltage level between a supply voltage source and a ground voltage to control the oscillating signal generating device.

According to a first embodiment of the present invention, an oscillating signal generating device is disclosed. The oscillating signal generating device comprises an oscillating circuit and a control signal generating circuit. The oscillating circuit is arranged to generate an oscillating signal according to a current controlled signal. The control signal generating circuit is coupled to the oscillating circuit, the control signal generating circuit is arranged to receive a first reference voltage and a second reference voltage, the control signal generating circuit is operated between the first reference voltage and the second reference voltage, and the control signal generating circuit is arranged to generate the current controlled signal according to a voltage input signal, wherein the control signal generating circuit is capable of monotonically generating the current controlled signal according to the voltage input signal when a voltage level of the voltage input signal falls between the first reference voltage and the second reference voltage.

According to a second embodiment of the present invention, a current controlled signal generating circuit is disclosed. The current controlled signal generating circuit comprises a first transconducting circuit, a current adjusting circuit, a second transconducting circuit, and a current mirror. The first transconducting circuit is arranged to receive a first reference voltage and a second reference voltage, and to operate between the first reference voltage and the second reference voltage, and the first transconducting circuit is arranged to generate a first current signal according to a voltage input signal. The current adjusting circuit is coupled to the first transconducting circuit, and arranged to generate a second current signal according a reference current and the first current signal. The second transconducting circuit is arranged to receive the first reference voltage and the second reference voltage, and operated between the first reference voltage and the second reference voltage, and the second transconducting circuit is arranged to generate a third current signal according to the voltage input signal. The current mirror is coupled to the current adjusting circuit and the second transconducting circuit, and arranged to generate a current controlled signal according to at least one of the second current signal and the third current signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
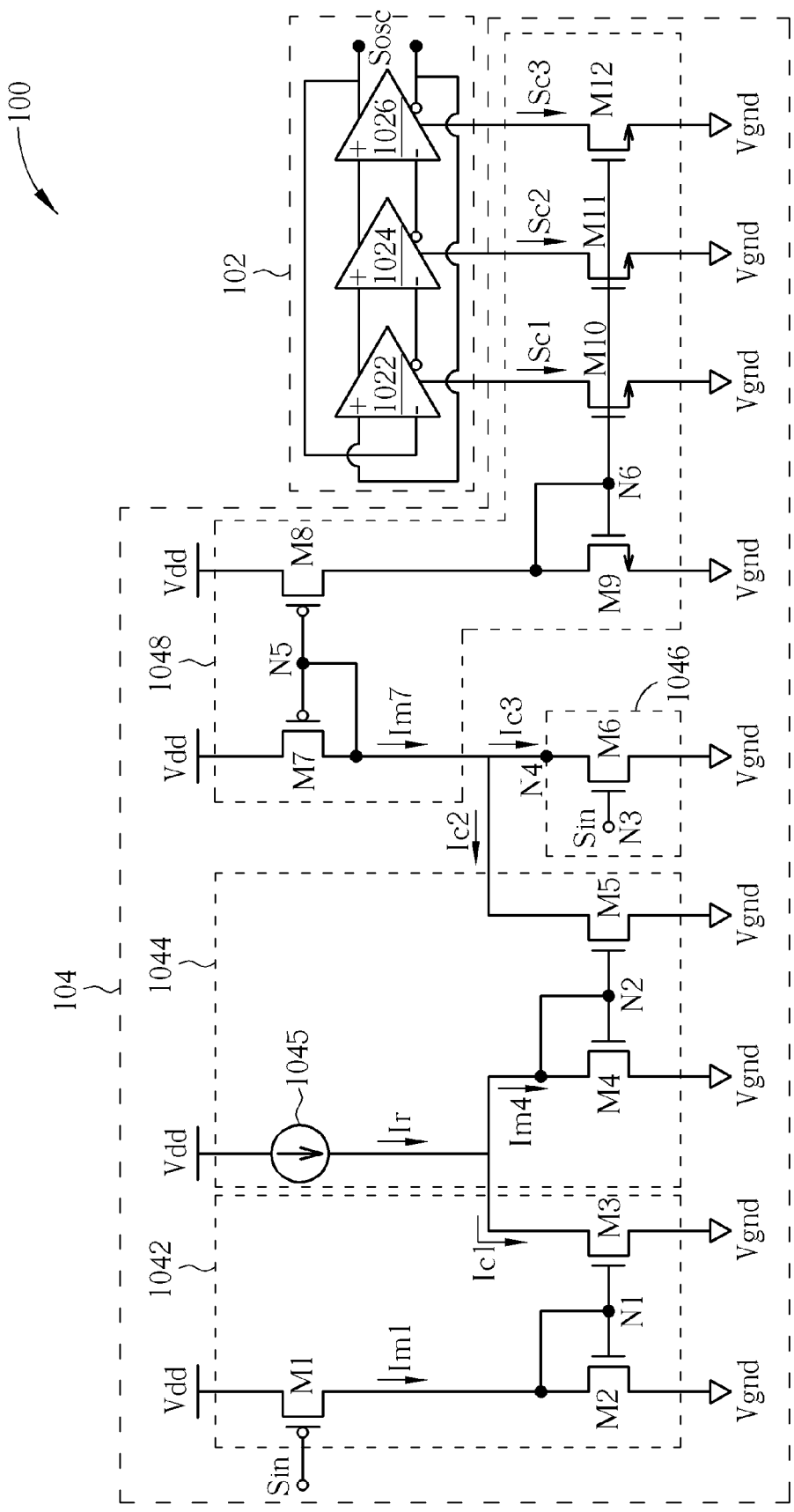
FIG. 1 is a diagram illustrating an oscillating signal generating device according to an embodiment of the present invention.

Please refer to FIG. 1, which is a diagram illustrating an oscillating signal generating device 100 according to an embodiment of the present invention. The oscillating signal generating device 100 comprises an oscillating circuit 102 and a control signal generating circuit 104. The oscillating circuit 102 is a three-stage ring oscillator, which is utilized to generate an oscillating signal Sosc according to the current controlled signals Sc1-Sc3. The oscillating circuit 102 comprises three delay units (inverters) 1022, 1024, and 1026, wherein the operating currents of the delay units 1022, 1024, and 1026 are controlled by the current controlled signals Sc1-Sc3 respectively as shown in FIG. 1. Please note that the oscillating circuit 102 and the number of the current controlled signals in the diagram is merely an example rather than a limitation of the present invention. The control signal generating circuit 104 is coupled to the oscillating circuit 102. The control signal generating circuit 104 receives a first reference voltage Vdd and a second reference voltage Vgnd, and the control signal generating circuit 104 is operated between the first reference voltage Vdd and the second reference voltage Vgnd. The control signal generating circuit 104 is utilized to generate the current controlled signals Sc1-Sc3 according to a voltage input signal Sin. In addition, the control signal generating circuit 104 is capable of monotonically generating the current controlled signals Sc1-Sc3 according to the voltage input signal Sin when a voltage level of the voltage input signal Sin falls between the first reference voltage Vdd and the second reference voltage Vgnd. Please note that, in this embodiment, the first reference voltage Vdd is a supply voltage source, and the second reference voltage Vgnd is a ground voltage.

To make the control signal generating circuit 104 monotonically generate the current controlled signals Sc1-Sc3 according to the voltage input signal Sin when the voltage level of the voltage input signal Sin falls between the first reference voltage Vdd and the second reference voltage Vgnd, the control signal generating circuit 104 at least comprises a P-type field effect transistor and an N-type field effect transistor. When the voltage level of the voltage input signal Sin is higher than the first voltage level, the N-type field effect transistor is arranged to convert the voltage input signal Sin into a first current signal; and when the voltage level of the voltage input signal Sin is lower than the second voltage level, the P-type field effect transistor is arranged to convert the voltage input signal Sin into a second current signal. In this embodiment, the current controlled signals Sc1-Sc3 comprises at least one of the above-mentioned first current signal and the second current signal.

More specifically, the control signal generating circuit 104 comprises a first transconducting circuit 1042, a current adjusting circuit 1044, a second transconducting circuit 1046, and a current mirror 1048. The first transconducting circuit 1042 is operated between the first reference voltage Vdd and the second reference voltage Vgnd, and is arranged to generate a first current signal Ic1 according to the voltage input signal Sin. The current adjusting circuit 1044 is coupled to the first transconducting circuit 1042, and is arranged to generate a second current signal Ic2 according to a reference current Ir and the first current signal Ic1. The second transconducting circuit 1046 is operated between the first reference voltage Vdd and the second reference voltage Vgnd, and is arranged to generate a third current signal Ic3 according to the voltage input signal Sin. The current mirror 1048 is coupled to the current adjusting circuit 1044 and the second transconducting circuit 1046, and is arranged to generate the current controlled signal Sc1-Sc3 according to at least one of the second current signal Ic2 and the third current signal Ic3.

According to the embodiment in FIG. 1, the first transconducting circuit 1042 comprises a P-type field effect transistor M1, a first N-type field effect transistor M2, and a second N-type field effect transistor M3. The P-type field effect transistor M1 has a controlling node coupled to the voltage input signal Sin, and a first connecting node coupled to the first reference voltage Vdd. The first N-type field effect transistor M2 has a controlling node N1 and a first connecting node coupled to a second connecting node of the P-type field effect transistor M1, and a second connecting node of the first N-type field effect transistor M2 coupled to the second reference voltage Vgnd. The second N-type field effect transistor M3 has a controlling node coupled to the controlling node N1 of the first N-type field effect transistor M2, a first connecting node arranged to output the first current signal Ic1, and a second connecting node coupled to the second reference voltage Vgnd.

The current adjusting circuit 1044 comprises a current source 1045, a first N-type field effect transistor M4, and a second N-type field effect transistor M5. The current source 1045 is utilized to generate the reference current Ir. The first N-type field effect transistor M4 has a controlling node N2 and a first connecting node coupled to the current source 1045 for conducting at least part of the reference current Ir. The second connecting node of the first N-type field effect transistor M4 is coupled to the second reference voltage Vgnd. The second N-type field effect transistor M5 has a controlling node coupled to the controlling node N2 of the first N-type field effect transistor M4, a first connecting node arranged to output the second current signal Ic2, and a second connecting node coupled to the second reference voltage Vgnd.

The second transconducting circuit 1046 comprises a N-type field effect transistor M6, which has a controlling node N3 coupled to the voltage input signal Sin, a first connecting node N4 arranged to output the third current signal Ic3, and a second connecting node coupled to the second reference voltage Vgnd.

The current mirror 1048 comprises a first P-type field effect transistor M7, a second P-type field effect transistor M8, an N-type field effect transistor M9, and a plurality of N-type field effect transistors M10-M12. The first P-type field effect transistor M7 has a first connecting node coupled to the first reference voltage Vdd, and a controlling node N5 and a second connecting node coupled to the first connecting node N4 of the transistor M6 for conducting at least part of the second current signal Ic2 and the third current signal Ic3. The second P-type field effect transistor M8 has a controlling node coupled to the controlling node N5 of the first P-type field effect transistor M7, and a first connecting node coupled to the first reference voltage Vdd. The N-type field effect transistor M9 has a controlling node N6 and a first connecting node coupled to a second connecting node of the second P-type field effect transistor M8. A second connecting node of the N-type field effect transistor M9 is coupled to the second reference voltage Vgnd. Each N-type field effect transistor of the plurality of the N-type field effect transistors M10-M12 has a controlling node coupled to the controlling node N6 of the N-type field effect transistor M9, a first connecting node arranged to output the current controlled signal (i.e. Sc1-Sc3), and a second connecting node coupled to the second reference voltage Vgnd.

According to the FIG. 1, when the oscillating signal generating device 100 is under the normal operation mode, the voltage input signal Sin is inputted to the P-type field effect transistor M1 and the N-type field effect transistor M6 simultaneously. Therefore, when the voltage difference between the voltage level of the voltage input signal Sin and the second reference voltage Vgnd is smaller than the threshold voltage Vthn of the N-type field effect transistor M6, the N-type field effect transistor M6 stops converting the voltage input signal Sin into a current signal, and the P-type field effect transistor M1 is then utilized to convert the voltage input signal Sin into a current signal. When the voltage level of the voltage input signal Sin is increased to make the voltage difference between the gate node of the P-type field effect transistor M1 and the first reference voltage Vdd smaller than the absolute value |Vthp| of the threshold voltage of the P-type field effect transistor M1, the P-type field effect transistor M1 stops converting the voltage input signal Sin into the current signal, and the N-type field effect transistor M6 is then utilized to convert the voltage input signal Sin into a current signal.

Figure 2:
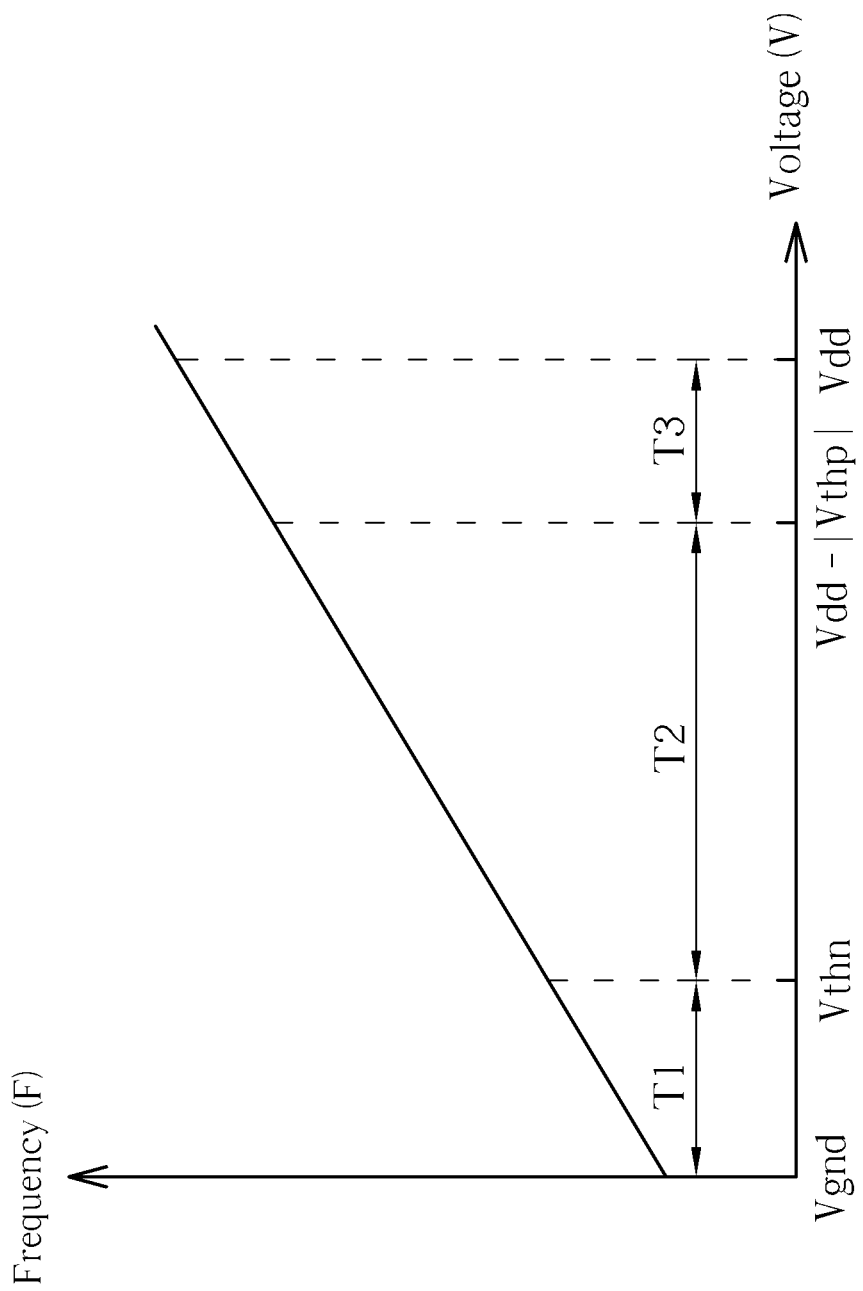
FIG. 2 is a diagram illustrating a relation between a controlling voltage level and an output oscillating frequency of an oscillating signal generating device according to an embodiment of the present invention.

Please refer to FIG. 2, which is a diagram illustrating the relation between the controlling voltage level V and the output oscillating frequency F of the oscillating signal generating device 100 according to an embodiment of the present invention, wherein the controlling voltage level V is the voltage level of the voltage input signal Sin, and the output oscillating frequency F is the oscillating frequency of the oscillating signal Sosc. Accordingly, when the voltage level of the voltage input signal Sin increases toward the supply voltage source (Vdd) from the zero voltage (Vgnd), the oscillating frequency of the oscillating signal Sosc also varies accordingly, e.g. the oscillating frequency of the oscillating signal Sosc may increase to a higher frequency from a lower frequency. More specifically, in the time interval T2, when the voltage level of the voltage input signal Sin starts to increase from the second reference voltage Vgnd, the current Im1 generated by the P-type field effect transistor M1 starts to decrease accordingly. As the first N-type field effect transistor M2 and the second N-type field effect transistor M3 are configured to be a current mirror, the first current signal Ic1 generated by the second N-type field effect transistor M3 starts to decrease when the voltage level of the voltage input signal Sin starts to increase from the second reference voltage Vgnd. Then, as the reference current Ir generated by the current source 1045 is a fixed current in the current adjusting circuit 1044, the current Im4 flowing through the first N-type field effect transistor M4 increases when the first current signal Ic1 decreases. In other words, Im4=Ir−Ic1. Moreover, as the first N-type field effect transistor M4 and the second N-type field effect transistor M5 are configured to be a current mirror, the second current signal Ic2 increases when the voltage level of the voltage input signal Sin is increased.

At the same time, as the voltage level of the voltage input signal Sin increases gradually, the third current signal Ic3 generated by the N-type field effect transistor M6 also increases gradually. Then, the current mirror 1048 mirrors a total current Im7 (Im7=Ic2+Ic3) of the second current signal Ic2 and the third current signal Ic3 into the current controlled signals Sc1-Sc3, and outputs the current controlled signals Sc1-Sc3 to the three delay units 1022, 1024, 1026 of the oscillating circuit 102. Please note that both the P-type field effect transistor M1 and the N-type field effect transistor M6 are turned on in the second time interval T2, and the current controlled signals Sc1-Sc3 are monotonically increased when the voltage level of the voltage input signal Sin is increased gradually. The oscillating frequency of the oscillating signal Sosc also increases, as shown in FIG. 2.

In the first time interval T1 (when the voltage level of the voltage input signal Sin falls between the second reference voltage Vgnd and the voltage Vthn), the N-type field effect transistor M6 is under the disable mode; therefore, the N-type field effect transistor M6 does not convert the voltage input signal Sin into the third current signal Ic3 when the voltage level of the voltage input signal Sin starts to increase from the second reference voltage Vgnd. At the same time, only the P-type field effect transistor M1 is used to convert the voltage input signal Sin into the current Im1. In the first time interval T1, when the voltage level of the voltage input signal Sin increases gradually from the second reference voltage Vgnd, the second current signal Ic2 also increases gradually, and then the current controlled signals Sc1-Sc3 are monotonically increased according to the second current signal Ic2.

In the third time interval T3 (when the voltage level of the voltage input signal Sin falls between the first reference voltage Vdd and the voltage Vdd−|Vthp|), the P-type field effect transistor M1 is under the disable mode; therefore, the P-type field effect transistor M1 does not convert the voltage input signal Sin into the current Im1 when the voltage level of the voltage input signal Sin starts to increase from Vdd−|Vthp| toward the first reference voltage Vdd. At the same time, only the N-type field effect transistor M6 is used to convert the voltage input signal Sin into the third current signal Ic3. In the third time interval T3, when the voltage level of the voltage input signal Sin increases gradually from the Vdd−|Vthp|, the second current signal Ic2 is the largest fixed current, the third current signal Ic3 is increased gradually, and the current controlled signals Sc1-Sc3 are then monotonically increased according to the third current signal Ic3.

According to the above description related to the operation of the control signal generating circuit 104, when the voltage level of the voltage input signal Sin starts to increase from the second reference voltage Vgnd to the first reference voltage Vdd, the current controlled signals Sc1-Sc3 are monotonically increased according to the voltage level of the voltage input signal Sin. In other words, the present control signal generating circuit 104 is capable of monotonically generating the current controlled signal Sc1-Sc3 according to the voltage input signal Sin if the voltage level of the voltage input signal Sin is any voltage between the supply voltage source (Vdd) and the ground voltage (Vgnd), which means that the usable voltage level of the voltage input signal Sin can be any voltage between the supply voltage source (Vdd) and the ground voltage (Vgnd) in this embodiment. Therefore, the controllable voltage range of the present oscillating signal generating device 100 becomes larger, and the oscillating circuit 102 is capable of generating a larger frequency range than its conventional counterpart under the same operating condition, i.e. having the same gain (Kvco). Accordingly, the jitter in the output of the oscillating circuit 102 can be reduced. Therefore, when the oscillating signal generating device 100 is applied in a phase-locked loop, the filtering capacitor of the loop filter of the phase-locked loop is smaller than its conventional counterpart, and thus the cost of manufacturing the phase-locked loop is reduced.

Please note that the control signal generating circuit 104 is not limited to controlling the oscillating circuit 102. After appropriate modifications, the control signal generating circuit 104 can also be applied to provide a controlling signal to any operation circuit according to the voltage input signal Sin for obtaining similar effects.

Briefly, the present oscillating signal generating device 100 uses a P-type field effect transistor and an N-type field effect transistor to receive the voltage input signal Sin at the same time, so that when the voltage level of the voltage input signal Sin is higher than a first voltage level, the N-type field effect transistor is capable of converting voltage input signal Sin into the current controlled signal of the oscillating circuit 102; and when the voltage level of the voltage input signal Sin is lower than a second voltage level, the P-type field effect transistor is capable of converting the voltage input signal Sin into the current controlled signal of the oscillating circuit 102. Accordingly, the usable voltage level of the voltage input signal Sin of the oscillating signal generating device 100 can be any voltage between the supply voltage source and the ground voltage in this embodiment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A current controlled signal generating circuit, comprising:

a first transconducting circuit, for receiving a first reference voltage and a second reference voltage, and operated between the first reference voltage and the second reference voltage, the first transconducting circuit arranged to generate a first current signal according to a voltage input signal;

a current adjusting circuit, coupled to the first transconducting circuit, and arranged to generate a second current signal according to a reference current and the first current signal;

a second transconducting circuit, for receiving the first reference voltage and the second reference voltage, and operated between the first reference voltage and the second reference voltage, the second transconducting circuit arranged to generate a third current signal according to the voltage input signal; and a current mirror, coupled to the current adjusting circuit and the second transconducting circuit, and arranged to generate a current controlled signal according to at least one of the second current signal and the third current signal.

2. The current controlled signal generating circuit of claim 1, capable of monotonically generating the current controlled signal according to the voltage input signal when a voltage level of the voltage input signal falls between the first reference voltage and the second reference voltage.

3. An oscillating signal generating device, comprising:
an oscillating circuit, arranged to generate an oscillating signal according to a current controlled signal; and
a control signal generating circuit, coupled to the oscillating circuit, the control signal generating circuit for receiving a first reference voltage and a second reference voltage, the control signal generating circuit operated between the first reference voltage and the second reference voltage, and the control signal generating circuit arranged to generate the current controlled signal according to a voltage input signal;
wherein the control signal generating circuit is capable of monotonically generating the current controlled signal according to the voltage input signal when a voltage level of the voltage input signal falls between the first reference voltage and the second reference voltage, and the control signal generating circuit comprises:
a first transconducting circuit, operated between the first reference voltage and the second reference voltage, and arranged to generate a first current signal according to the voltage input signal;
a current adjusting circuit, coupled to the first transconducting circuit, and arranged to generate a second current signal according to a reference current and the first current signal;
a second transconducting circuit, operated between the first reference voltage and the second reference voltage, and arranged to generate a third current signal according to the voltage input signal; and
a current mirror, coupled to the current adjusting circuit and the second transconducting circuit, arranged to generate the current controlled signal according to at least one of the second current signal and the third current signal.

4. The oscillating signal generating device of claim 3, wherein the first reference voltage is a supply voltage and the second reference voltage is a ground voltage.

5. The oscillating signal generating device of claim 3, wherein the first transconducting circuit comprises:
a first field effect transistor, having a controlling node coupled to the voltage input signal, and a first connecting node coupled to the first reference voltage;
a second field effect transistor, having a controlling node and a first connecting node coupled to a second connecting node of the first field effect transistor, and a second connecting node coupled to a second reference voltage; and
a third field effect transistor, having a controlling node coupled to the controlling node of the second field effect transistor, a first connecting node arranged to output the first current signal, and a second connecting node coupled to the second reference voltage.

6. The oscillating signal generating device of claim 5, wherein the first field effect transistor is a P-type field effect transistor, and the second field effected transistor and the third filed effect transistor are N-type field effect transistors.

7. The oscillating signal generating device of claim 3, wherein the current adjusting circuit comprises:
a current source, arranged to generate the reference current;
a first field effect transistor, having a controlling node and a first connecting node coupled to the reference current, and a second connecting node of the first field effect transistor coupled to the second reference voltage; and
a second field effect transistor, having a controlling node coupled to the controlling node of the first field effect transistor, a second connecting node arranged to output the second current signal, and a second connecting node coupled to the second reference voltage.

8. The oscillating signal generating device of claim 7, wherein the second field effect transistor and the third field effect transistor are N-type field effect transistors.

9. The oscillating signal generating device of claim 3, wherein the second transconducting circuit comprises:
a field effect transistor, having a controlling node coupled to the voltage input signal, a second connecting node arranged to output the third current signal, and a second connecting node coupled to the second reference voltage.

10. The oscillating signal generating device of claim 9, wherein the field effect transistor is an N-type field effect transistor.

11. The oscillating signal generating device of claim 3, wherein the current mirror comprises:
a first field effect transistor, having a first connecting node coupled to the first reference voltage, and a controlling node and a second connecting node coupled to the second current signal and the third current signal respectively;
a second field effect transistor, having a controlling node coupled to the controlling node of the first field effect transistor, and a first connecting node coupled to the first reference voltage;
a third field effect transistor, having a controlling node and a first connecting node coupled to a second connecting node of the second field effect transistor, and a second connecting node of the third field effect transistor coupled to the second reference voltage; and
at least a fourth field effect transistor, having a controlling node coupled to the controlling node of the third field effect transistor, a first connecting node arranged to output the current controlled signal, and a second connecting node coupled to the second reference voltage.

12. The oscillating signal generating device of claim 11, wherein the first field effect transistor and the second field effect transistor are N-type field effect transistors, and the third field effect transistor and the fourth field effect transistor are P-type field effect transistors.

13. An oscillating signal generating device, comprising:
an oscillating circuit, arranged to generate an oscillating signal according to a current controlled signal; and a control signal generating circuit, coupled to the oscillating circuit, the control signal generating circuit for receiving a first reference voltage and a second reference voltage, the control signal generating circuit operated between the first reference voltage and the second reference voltage, and the control signal generating circuit arranged to generate the current controlled signal according to a voltage input signal;

wherein the control signal generating circuit is capable of monotonically generating the current controlled signal according to the voltage input signal when a voltage level of the voltage input signal falls between the first reference voltage and the second reference voltage, and the control signal generating circuit comprises a P-type field effect transistor and an N-type field effect transistor; when the voltage level of the voltage input signal is higher than a first voltage level, the N-type field effect transistor converts the voltage input signal into a first current signal; and when the voltage level of the voltage input signal is lower than a second voltage level, the P-type field effect transistor converts the voltage input signal into a second current signal; and the current controlled signal comprises at least one of the first current signal and the second current signal.

* * * * *